United States Patent [19]

Tanaka et al.

[11] Patent Number: 4,511,448
[45] Date of Patent: Apr. 16, 1985

[54] PLATING APPARATUS

[75] Inventors: Seiitch Tanaka; Akitoshi Inoue, both of Tokyo, Japan

[73] Assignee: Anritsu Electric Company Limited, Tokyo, Japan

[21] Appl. No.: 266,395

[22] Filed: May 22, 1981

[51] Int. Cl.³ .................... C25D 17/08; C25D 17/28; B05C 3/00

[52] U.S. Cl. ............................. 204/198; 204/297 W; 118/425

[58] Field of Search .......................... 204/198, 297 W; 198/342; 118/425, 696, 697, 698; 134/76, 77

[56] References Cited

U.S. PATENT DOCUMENTS

| 3,133,007 | 5/1964 | Creese et al. | 204/198 |
| 3,455,809 | 7/1969 | Geilert | 204/198 |
| 3,760,927 | 9/1973 | Zambon | 198/342 |
| 3,888,270 | 6/1975 | Crapet | 204/198 X |
| 4,012,309 | 3/1977 | Eslien et al. | 204/297 W |
| 4,063,651 | 12/1977 | Chino | 134/76 X |
| 4,148,707 | 4/1979 | Mayer et al. | 204/297 W |

Primary Examiner—Donald R. Valentine
Attorney, Agent, or Firm—Jordan and Hamburg

[57] ABSTRACT

A plating apparatus having a plurality of retaining racks, comprising loading-unloading stations for loading an unplated article onto each of the retaining racks and for unloading a plated article from each of the retaining racks, treating baths for plating the unplated articles a conveyance mechanism for conveying the retaining racks, and a plurality of stock yard stations for temporarily receiving the retaining racks, the stock yard stations being disposed immediately below a path traversed by the conveyance mechanism and adjacent the loading-unloading stations and treating baths.

8 Claims, 18 Drawing Figures

PLATING APPARATUS

BACKGROUND OF THE INVENTION

This invention relates to a plating apparatus and, more particularly, to a program-controlled plating apparatus for increasing plating productivity.

It is general practice with an automatic plating apparatus to employ a program prepared to include instructions for a series of treating steps and treatment times that are necessary to effect plating, and to drive a conveyance mechanism in the manner instructed by the program to convey racks through the required treatments, the racks carrying the articles that are to be plated.

With the conventional automatic plating apparatus of the type described, use of the plating baths must be discontinued one after another, starting a good deal before the workers are scheduled to stop replacing the plated articles, as occurs at the noon recess or at the close of work. This places a limitation upon plating productivity.

A similar problem arises with the conventional program controlled plating apparatus in a case where the treatments and treating times differ because articles of different types are to be plated. When carrying out such plating automatically in accordance with the program, difficulties are encountered in programming and the conveyance mechanism cannot always be utilized effectively. This has the same effect as mentioned above, namely a limitation upon plating productivity.

SUMMARY OF THE INVENTION

Accordingly, it is an object of the present invention to provide a plating apparatus in which the foregoing difficulties have been eliminated.

It is another object of the present invention to provide an improved retaining apparatus specifically suited for use in a plating apparatus.

DESCRIPTION OF THE PREFERRED EMBODIMENTS

Figure 1:
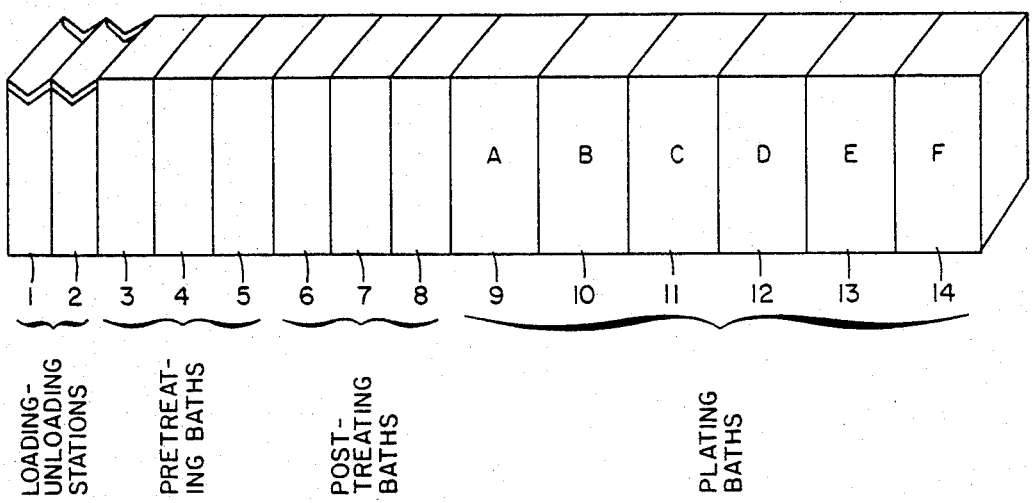
FIG. 1 shows an arrangement of baths in a program-controlled plating apparatus according to the prior art.

FIG. 1 illustrates the manner in which treating baths and loading-unloading stations are arrayed for carrying out plating in the conventional program-controlled plating apparatus.

In FIG. 1, numerals 1 and 2 denote loading-unloading stations where racks are received and dispatched in order to unload plated articles from the racks and load unplated articles onto the racks. Adjoining the loading-unloading stations 1, 2 are pretreating baths 3 through 5 for subjecting an unplated article to a pretreatment such as degreasing water washing and acid washing. Contiguous the pretreatment baths 3 through 5 are post-treating baths 6 through 8 for subjecting plated articles to post-treatment such as plating solution recovery and water washing. Contiguous the post-treating baths 6 through 8 are plating baths 9 through 14.

Figure 2:
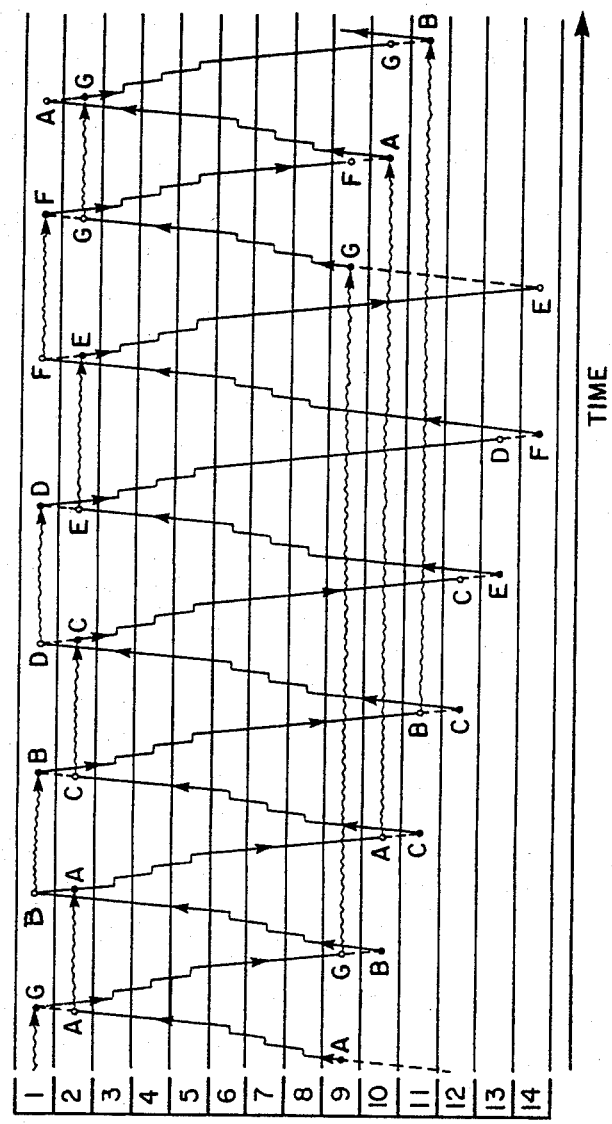
FIG. 2 illustrates an example of the operation of a conveyance mechanism employed in the prior art apparatus of FIG. 1.

FIG. 2 is an example showing how the conveyance mechanism may be operated by convey racks to each of the stations and baths in FIG. 1 in accordance with commands received from a programmed control unit. In FIG. 2, the linear solid lines indicate when a rack is being conveyed by the conveyance mechanism, the dashed lines indicate when no rack is being conveyed, the black circles indicate when a rack is raised, and the white circles indicate when a rack is off-loaded.

The operation depicted in FIG. 2 will now be described in more detail. Racks A through F, each carrying an unplated article or articles, are received in respective ones of the plating baths 9 through 14 where a plating treatment is being carried out. The arrangement is such that, at any given time, the articles immersed in the progressively lower numbered plating baths have been under treatment for progressively longer periods. The conveyance mechanism raises the rack A from the plating bath 9, the rack having spent the prescribed treating time immersed in the bath, conveys the rack A successively to the post-treating baths 8, 7, 6 where the rack is immersed and the plated article subjected to post-treatment, and then conveys the rack to the loading-unloading station 2 where the rack is lowered and removed, as will be described later. The conveyance mechanism, now free of the rack A, is transferred to the loading-unloading station 1. Here, a workman, who has previously received a rack G carrying a plated and post-treated article conveyed to him in the manner just described, and who has unloaded the plated article from the rack G and replaced it with an unplated article, now attaches the rack G, bearing the unplated article, to the lowered conveyance mechanism. The latter now raises the rack G, conveys it successively to the pretreating baths 3, 4, 5 where the rack G is immersed and the unplated article subjected to pretreatment, and then conveys the rack G to the plating bath 9 where it is off-loaded to immerse the pretreated article in the bath to effect plating. Meanwhile, the worker at the loading-unloading station 2 is unloading the previously completed plated article from the rack A, which he removed from the lowered conveyance mechanism. He will then load an unplated article onto the rack A which he will reattach to the conveyance mechanism upon its next arrival.

The conveyance mechanism, after it has off-loaded the rack G in the plating bath 9, is shifted, free of the rack, to the plating bath 10 from whence it raises the rack B which has spent the prescribed treating time immersed in the bath. It then conveys the rack to post-treat the plated article in the post-treating baths 8, 7, 6 in the manner described above, after which it conveys the rack to the loading-unloading station 1 where the rack B is off-loaded. The conveyance mechanism, now free of the rack B, is transferred to the loading-unloading station 2 from whence it raises the rack A carrying the newly attached unplated article. The conveyance mechanism conveys the rack A to pretreat the unplated article in the manner described above, and then conveys the rack A to the plating bath 10 where the rack is off-loaded to immerse the article. Next, through the same steps described above, the rack C is taken from the plating bath 11, conveyed to the post-treating baths and to the loading-unloading station 2 where the rack C is off-loaded. Then the rack B, bearing a newly attached unplated article, is taken from the loading-unloading station 1 to the pre-treating baths and then onward to the plating bath 11 where the rack B is off-loaded to immerse the article for plating. In this manner the racks are withdrawn from and immersed in the plating baths 12, 13, 14 in the order mentioned, with the process then being repeated starting with the bath 9. Plated articles are removed from the racks and replaced by unplated ones at the loading-unloading stations 1, 2 as the plating operation progresses.

At such times as the noon recess or the close of work, the operation of replacing plated articles with unplated ones ceases. If the plating process were to continue at such times under the automatic control of the program, the racks bearing the completed plated articles would not be removed from the conveyance mechanism at the loading-unloading stations, and these articles would, therefore, undergo treatment a second time. Accordingly, starting at a certain time prior to that at which the workers are scheduled to stop replacing the plated articles, such articles must be removed from the racks lowered into the loading-unloading stations 1, 2, but they must not be replaced by unplated articles. According to this procedure, the conveyance mechanism, in response to the program, sequentially raises the racks bearing the completed articles from the successive plating baths and then conveys empty racks to the plating baths where the empty racks are off-loaded. The schedule is so planned that this operation is completed at all of the plating baths by the time that work is to stop, after which the conveyance mechanism is shut down.

Thus, with the conventional program-controlled plating apparatus of the type described, use of the plating baths must be discontinued one after another, as described above, starting a good deal before the workers are scheduled to stop replacing the plated articles, as occurs at the noon recess or at the close of work. This places a limitation upon plating productivity.

A similar problem arises with the conventional program controlled plating apparatus in a case where the treatments and treating times differ because articles of different types are to be plated. When carrying out such plating automatically in accordance with the program, difficulties are encountered in programming and the conveyance mechanism cannot always be utilized effectively. This has the same effect as mentioned above, namely a limitation upon plating productivity.

The present invention contemplates the provision of a program-controlled plating apparatus in which the foregoing difficulties have been eliminated.

A description of a preferred embodiment of the present invention will now be described in conjunction with the accompanying drawings.

Figure 3:
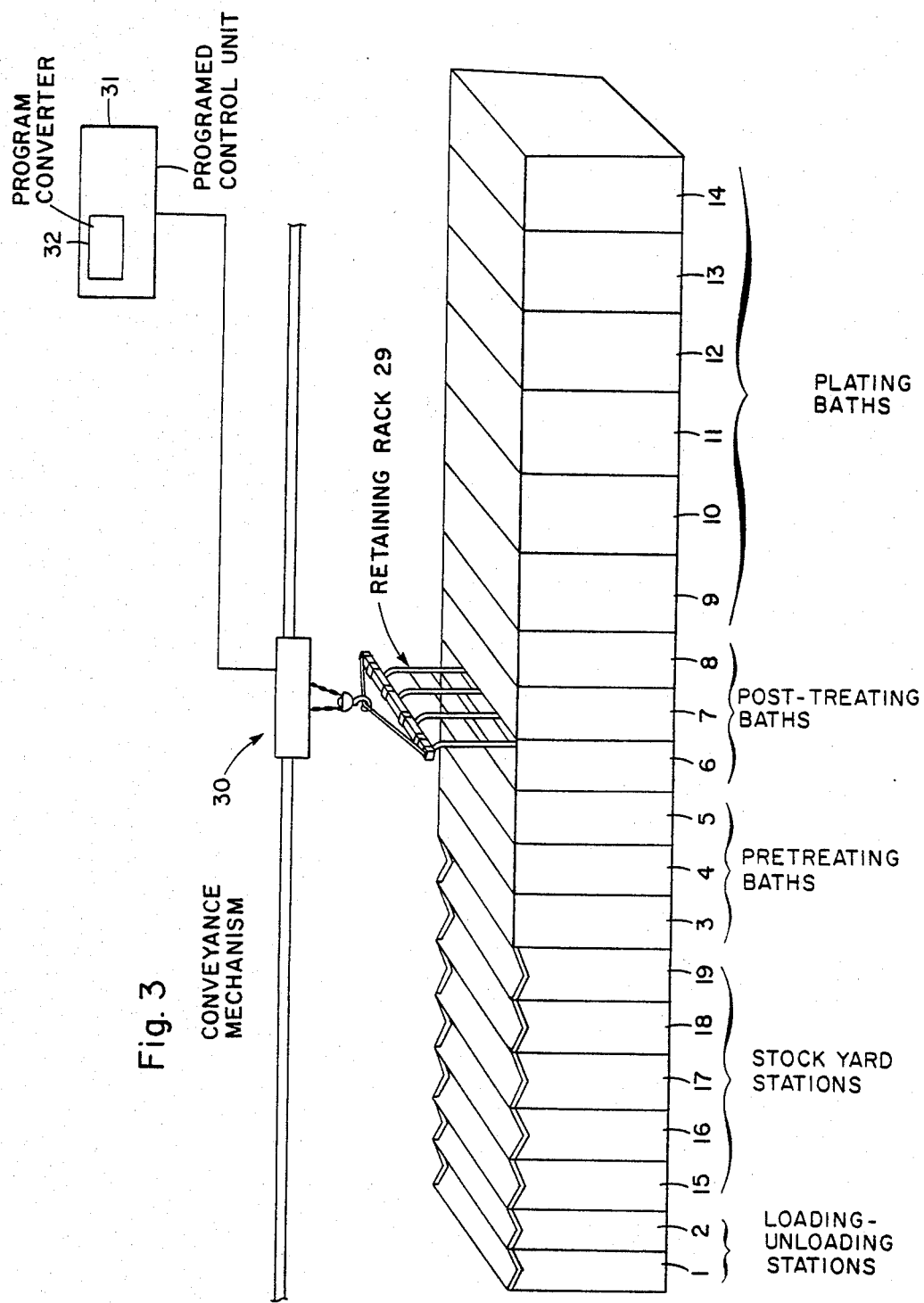
FIG. 3 is a schematic view showing a program-controlled plating apparatus according to the present invention.

FIG. 3 illustrates the manner in which treating baths and the like are arrayed for carrying out plating in the program-controlled plating apparatus embodying the present invention.

Referring now to FIG. 3, numerals 1 and 2 denote the loading-unloading stations, 3 through 5 the pretreating baths, 6 through 8 the post-treating baths, and 9 through 14 the plating baths. The conveyance mechanism is indicated at numeral 30. Provided between the loading-unloading station 2 and the pretreating bath 3, and immediately below the path traversed by the conveyance mechanism 30, are a plurality of stock yard stations 15 through 19 which are neither plating, pretreating nor post-treating baths nor loading-unloading stations. These stock yard stations 15 through 19 are adapted to receive and temporarily retain, by means of supports, racks 29 that have been carried there by the conveyance mechanism 30.

In FIG. 3, the conveyance mechanism 30 travels above the loading-unloading stations 1, 2, the stock yard stations 15 through 19, and the treating baths 3 through 14, and is adapted to convey the rack to each of these positions and to both raise and off-load the rack. The operation of the conveyance mechanism 30 is controlled in accordance with the program by a programmed control unit 31. The latter is provided with a program converter 32 that effects a conversion between a program for executing the ordinary plating steps, and a program for executing an automatic stopping operation for use in conveying the racks when work is scheduled to stop.

Figure 4:
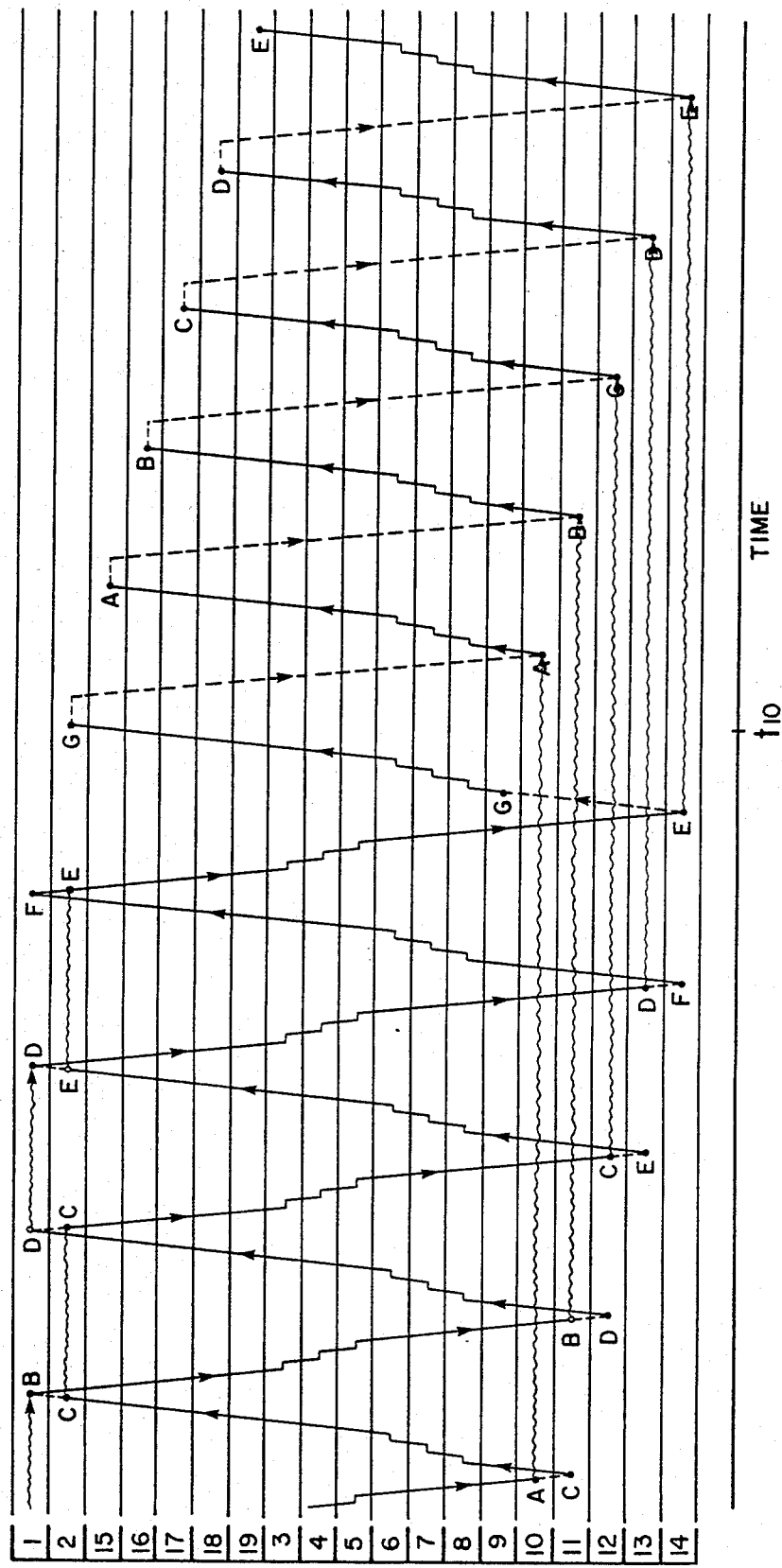
FIG. 4 illustrates an example of the operation of the conveyance mechanism when stock yard stations are utilized in an automatic stopping operation.

FIG. 4 illustrates an example of the operation of the conveyance mechanism 30 for a case in which the stock yard stations are utilized in an automatic stopping operation following an ordinary plating operation using the program-controlled plating apparatus shown in FIG. 3.

The example depicted in FIG. 4 shows how the conveyance mechanism 30 is operated in accordance with commands from the programmed control unit in response to a program for executing the ordinary plating process which is in effect up until the point in time $t_{10}$. This operation is approximately the same as that described in conjunction with FIG. 2, wherein racks whose articles have been plated in the plating baths 9 through 14 are sequentially exchanged at the loading-unloading stations 1, 2 for racks whose plated articles have been replaced by unplated ones.

The conveyance mechanism 30 is operated in accordance with the program and the replacement of plated articles with unplated ones continues until the scheduled work stoppage at time $t_{10}$, namely when the workers cease the replacement activity because of the noon recess or because it is the end of the working day. At time $t_{10}$, the program converter 32 of the programmed control unit 31 effects the changeover from the ordinary program to the program for the automatic stop operation, whereby the conveyance mechanism 30 continues operating as instructed by the second program even in the absence of the workers.

An example of the operaiton performed by the conveyance mechanism 30 in accordance with the second program will now be described with further reference to FIG. 4.

The conveyance mechanism 30, after it has lowered a rack E bearing an unplated article into the plating bath 14, proceeds to the plating bath 9 from whence it raises a rack (the rack G, for example) which has spent the prescribed treating time immersed in the bath. The conveyance mechanism conveys the rack G to the post-treating baths 8, 7, 6 for successive post-treatment, and they conveys the rack to the loading-unloading station 2 where the rack is lowered. Next, once free of the rack, the conveyance mechanism is transferred to the plating bath 10 from whence it raises the rack A which has spent the prescribed heating time immersed in the bath. The conveyance mechanism conveys the rack A to the post-treating baths for post treatment as described above but now, following the pre-treatment, conveys the rack A to the stock yard station 15 where the rack A is off-loaded. Thereafter, and in a similar manner, the conveyance mechanism sequentially conveys the racks B, C, D, E, whose articles have spent the prescribed time under treatment, from the plating baths 11, 12, 13, 14 to the post-treating baths and then on to the stock yard stations 16, 17, 18, 19, respectively, where the racks are off-loaded.

In accordance with the foregoing arrangement, plating at the plating baths 9 through 14 is not successively halted starting at a point in time prior to a work stoppage, as in the conventional program-controlled plating apparatus. Instead, all of the plating baths 9 through 14 can continue to be utilized up until the scheduled work stoppage at time $t_{10}$. Moreover, plating of the articles continues even following the work stoppage, measured from time $t_{10}$ onward, until the racks have spent the prescribed time in the plating baths 9 through 14 and are raised therefrom. Thus, employing the stock yard stations in the automatic stopping operation in the manner described affords a prominent increase in plating productivity.

Figure 5:
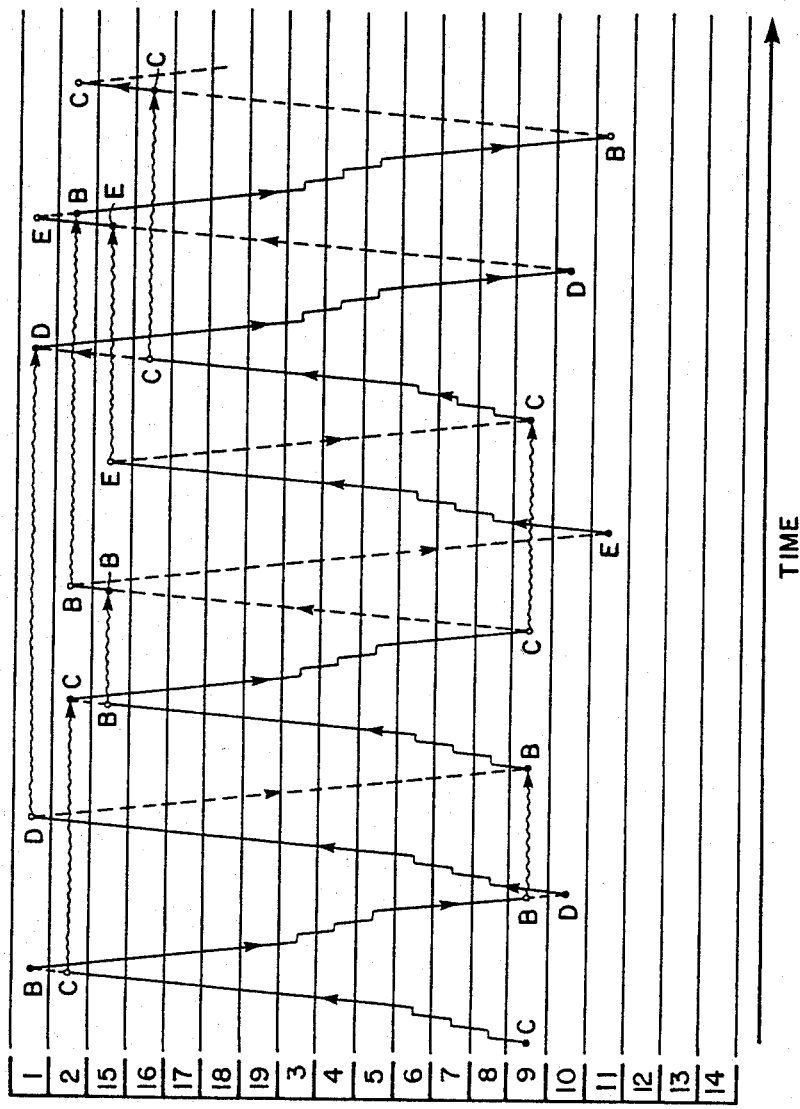
FIG. 5 illustrates an example of the operation of the conveyance mechanism when stock yard stations are utilized in the treating of articles that require different treating times.

FIG. 5 illustrates an example of the operation of the conveyance mechanism 30 for a case in which the stock yard stations are utilized in the program-controlled plating of articles that require different treatments and treating times.

To describe the operation of the conveyance mechanism according to the example shown in FIG. 5, it is assumed that the unplated articles loaded on the rack B, C are assigned prescribed treating times which are much shorter than the treating times of the other articles. In such case the conveyance mechanism immerses the rack B in the plating bath 9. The conveyance mechanism then proceeds to the plating bath 10 to retrieve the rack D whose article has been fully plated, and off-loads the rack D in the loading-unloading station 1 after conveying the rack to the post-treating baths 8, 7, 6. Next, the conveyance mechanism, which is now free of the rack, is transferred to the plating bath 9 from whence it retrieves the rack B and then conveys it to the post-treating baths. Since the racks D, C have been offloaded in the loading-unloading stations 1, 2, respectively, the conveyance mechanism conveys the rack B, whose article has undergone post-treatment, to the stock yard station 15 where the rack B is temporarily off-loaded. Next, the conveyance mechanism proceeds to the loading-unloading station 2 from whence it conveys the rack C, onto which an unplated article has been newly loaded, to the pre-treating baths and then on the plating bath 9 where the rack C is immersed. Once free of the rack C, the conveyance mechanism returns to the stock yard station 15, lifts the rack B from the stock yard station, and carries the rack B to the loading-unloading station 2 where the rack is lowered and off-loaded. Next, the rack E, whose article has been fully plated in the plating bath 11, is pulled up from the bath 11 and carried to the post-treating baths. Since the racks D, B have been off-loaded in the loading-unloading stations 1, 2, respectively, the rack E is carried to the stock yard station 15 and off-loaded there. The rack C, which has spent the prescribed treating time in the plating bath 9, is subsequently raised from the bath, conveyed to the post-treating baths, and then on to the stock yard station 16 where the rack C is off-loaded. Next, the rack D, whose plated article has been replaced by an unplated one in the loading-unloading station 1, is carried to the pre-treating baths and then on to the plating bath 10 where it is off-loaded. The conveyance mechanism then shifts to the stock yard station 15, raises the rack E from the stock yard station and conveys it to the loading-unloading station 1 where it is off-loaded. Next, the rack B, whose plated article has been replaced by an unplated one in the loading-unloading station 2, is raised and then carried to the pretreating baths and then on to the plating bath 11. The conveyance mechanism subsequently proceeds to the stock yard station 16 from whence it raises the rack C, this then being carried to the loading-unloading station 2 where it is off-loaded.

Thus, by temporarily off-loading and retaining the racks in the stock yard stations in the above manner, articles that require different treatments and treating times can be treated smoothly. Programming is facilitated as well.

The apparatus of the present invention is not limited solely to the application exemplified in FIG. 5. For example, the apparatus may be employed to temporarily off-load and retain a rack in a stock yard station without halting the entire processing operation if an irregularity should develop in, say, a plating bath.

In accordance with the present invention as described above, racks can be temporarily retained by providing stock yard stations, in addition to the plating baths and loading-unloading stations, in the path traversed by the racks carried by the conveyance mechanism. Therefore, (a) it is easier to prepare the program employed in the program-controlled plating apparatus, and plating productivity is raised owing to more effective utilization of the conveyance mechanism; (b) the period of time the plating baths are in use can be lengthened, thereby to greatly improve plating productivity, by utilizing the automatic stopping feature at the time of a scheduled work stoppage, as occurs at the noon recess and at the close of the working day; and (c) the plating operation can be carried out more smoothly by employing the automatic stopping feature at the time of an accident or the like.

FIGS. 6 through 14 illustrate a preferred example of the retaining rack 29 shown in FIG. 3, the rack being employed to retain printed circuit boards.

In FIGS. 6 through 14, numeral 111 denotes a first electrically conductive member (a movable cathode bar) in the form of a horizontally disposed column having a rectangular cross-section. The first electrically conductive member 111, while remaining in a horizontal attitude, is raised and lowered and horizontally transported by the conveyance mechanism 30 (see FIG. 3) through the intermediary of holders 112, 112 projectively provided on the upper side of the member 111 at both ends thereof. The first electrically conductive member 111 is so adapted as to be removably placed on the upper portion of a plating bath or unloading station by means of bifurcated electrically conductive rods 113, 113 provided on both ends of the member 111 and projecting longitudinally with respect thereto.

The first electrically conductive member 111 is removably and slidably suspended from a second electrically conductive member 114 while in electrical contact therewith.

Figure 6A:
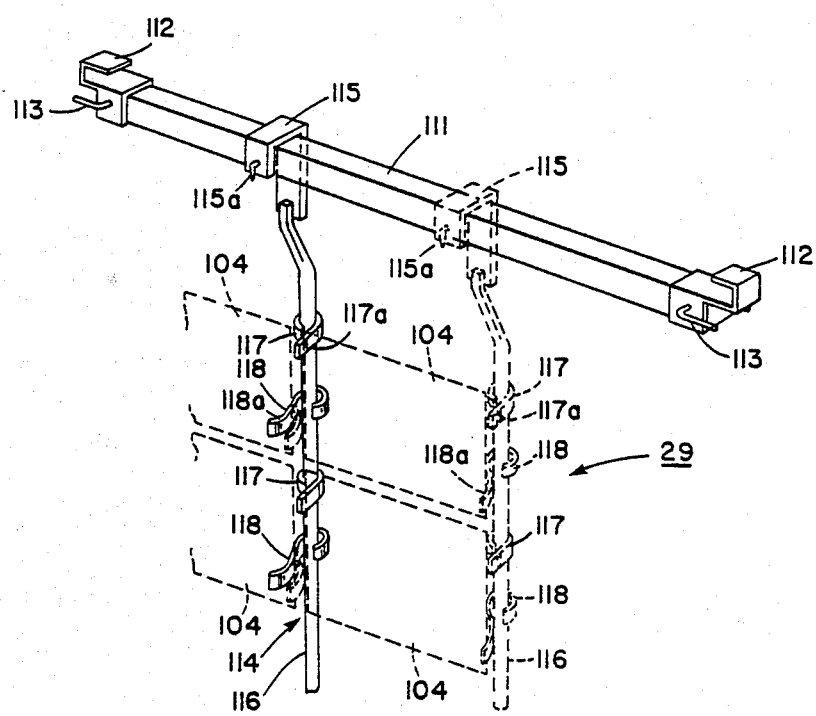
FIGS. 6A and 6B illustrate a preferred example of a retaining rack in which a second electrically conductive member fixed to a first electrically conductive member.
Figure 6B:
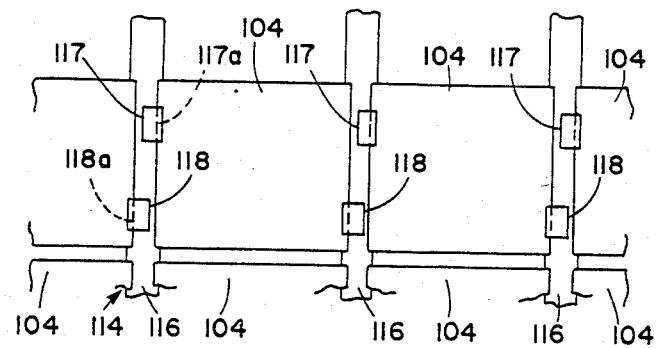
Figure 7:
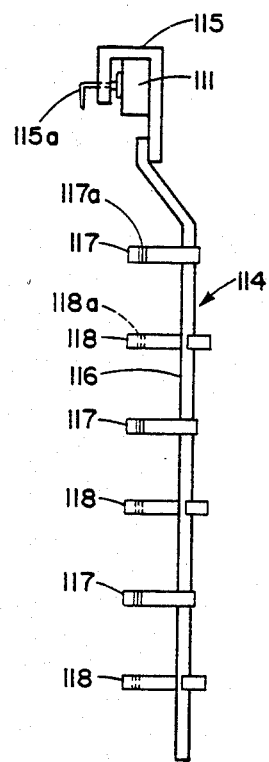
FIG. 7 is a side view showing the second electrically conductive member.
Figure 8:
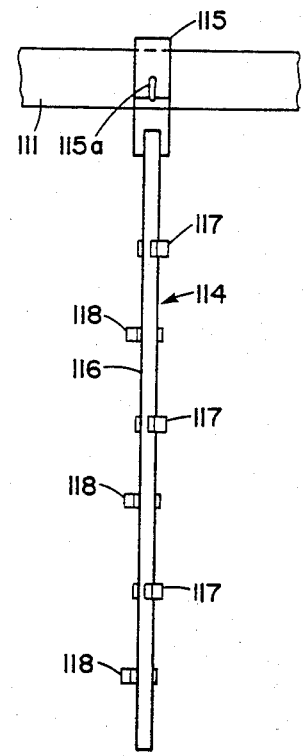
FIG. 8 is a front view of the second electrically conductive member.

The second electrically conductive member 114 comprises a hanger 115 which is bent into a C-shaped configuration so as to conform to the shape of the first electrically conductive member 111, and a bar-like portion 116 connected to the hanger 115. The latter is so adapted that it can be fixed to any point along the first electrically conductive member 111 by means of a fastener 115a. Alternately attached to the bar-like portion 116 at prescribed intervals are supporting contact portions 117, 118 of two types. These are to supply an electric current to the circuit boards 104 while they embrace and support the boards, and they project from the bar-like portion 116 in a direction which is perpendicular to the longitudinal direction of the first electrically conductive member 111. Contacts 117a, 118a at the tips of the respective supporting contact portions 117, 118 are positioned on opposite sides of the bar-like portion 116, as shown in FIG. 6B, and the supporting contact portion 118 has resilience for urging a printed circuit board 104 toward the contact 117a.

It should be noted that the second electrically conductive member 114 is coated with an insulator except for the contacts 117a, 118a of the supporting contact portions 117, 118 in order to prevent the deposition of a layer by electroplating.

Figure 9:
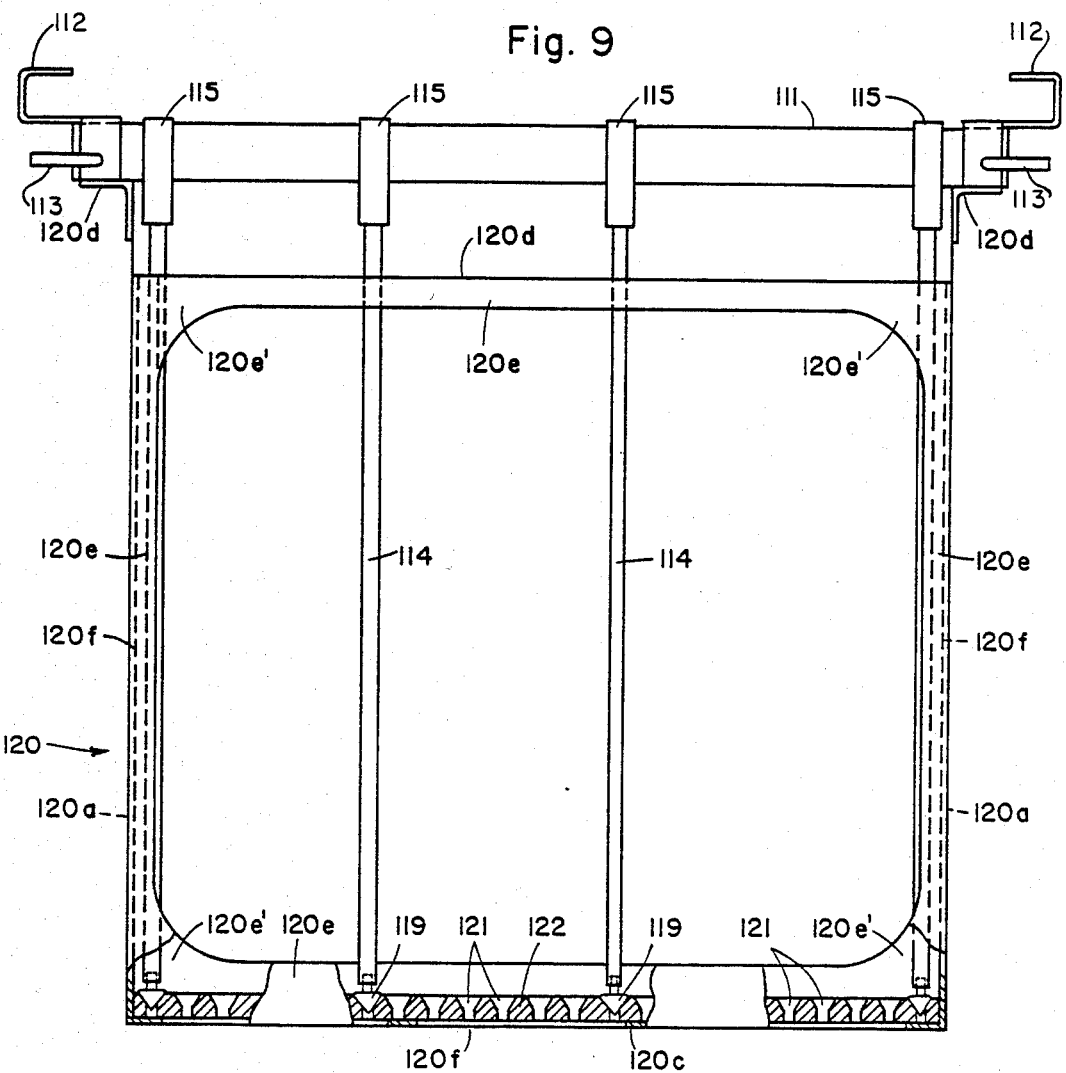
FIG. 9 is a front view showing the second electrically conductive member with its upper and lower ends fixed.
Figure 10:
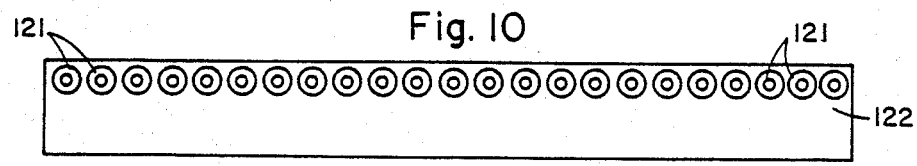
FIG. 10 is a plan view of a positioning member.
Figure 11:
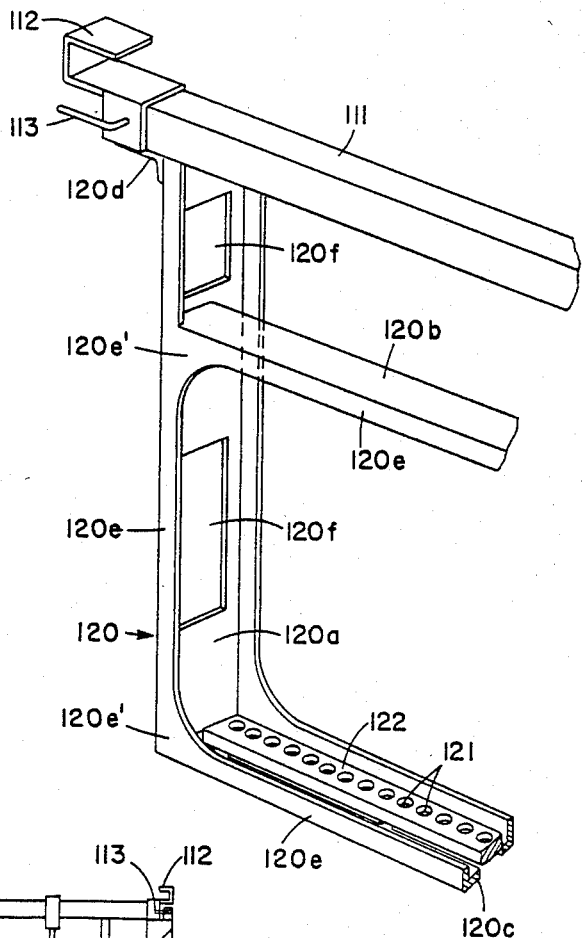
FIG. 11 is a partial perspective view of a shielding frame.

Provided on the lower part of the first electrically conductive member 111 so as to surround the region in which the second electrically conductive members 114 move is a shielding frame 120 (see FIG. 9) that prevents an overly thick plating layer, caused by a concentration of electric current, from forming on portions of the outermost printed circuit boards 104, 104 . . . of the plurality of arrayed and retained printed circuit boards. The shielding frame therefore provides a uniform plating thickness on the plurality of printed circuit boards 104, 104. More specifically, as illustrated in FIGS. 9 and 11, the shielding frame 120 includes left and right vertical side walls 120a, 120a, a horizontal upper wall 120b, a horizontal lower wall 120c, mounting portions 120d, 120d which are bent to extend at right angles from upper extensions of the left and right walls 120a, 120a, and borders 120e, 120e which are perpendicular to the side walls 120a, 120a, upper wall 120b and lower wall 120c, the walls and borders being so arranged as to enclose from all sides the space in which the printed circuit boards 104, 104 . . . are arrayed. The shielding frame 120 is attached to the lower side of the first electrically conductive member 111 at both ends thereof by means of the mounting members 120d, 120d. The borders 120e, 120e are broadened at the corner portions 120e', 120e'. The shielding frame 120 may consist of an insulating material or of a metal whose surface has been coated with an insulator. Openings 120f are formed in the walls 120a through 120c.

Affixed to the upper side of the lower wall 120c of the shielding frame 120 is a positioning member 122 along the longitudinal direction of which a plurality of penetrating engagement holes 121, 121 . . . are bored at a prescribed pitch. The positioning member 122 positions the second electrically conductive members 114, 114 . . . by allowing the lower ends of these members, which are attached to the first electrically conductive member 111, to mate with the engagement holes 121, 121.

The mating engagement between the lower ends of the second electrically conductive members 114 and the holes 121 can be facilitated and accomplished more reliably by flaring the upper portion of each hole 121 and by attaching a conical taper pin 119, conforming to the flared upper portion of the hole 121, to the lower end of each second electrically conductive member 114. The taper pin 119 is insulated to prevent the deposition of a plating layer.

Figure 12:
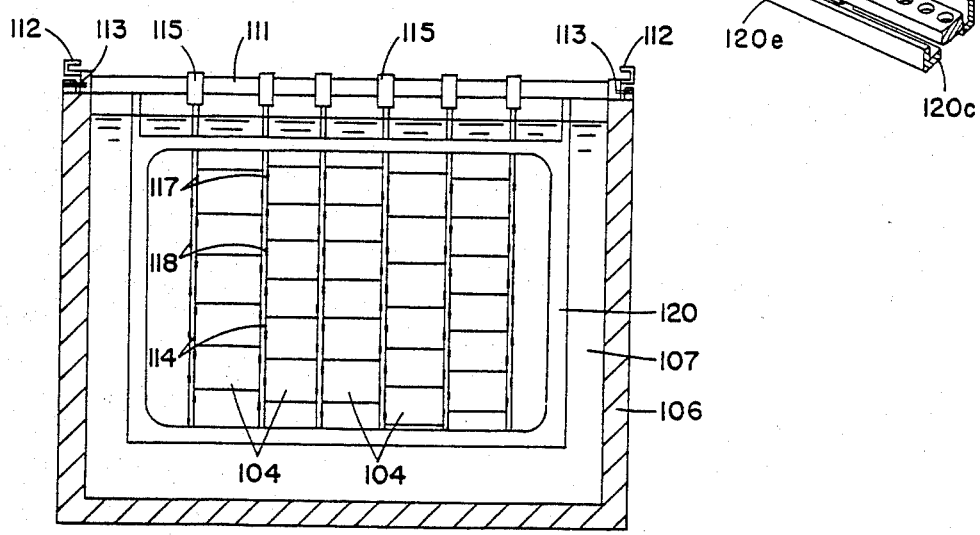
FIG. 12 is a front view showing printed circuit boards in the attached state.
Figure 13:
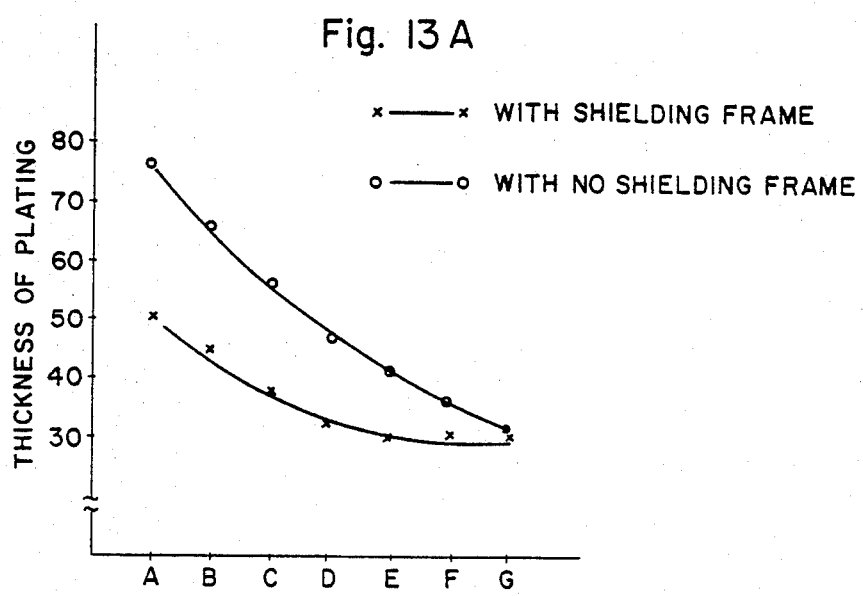
FIG. 13A is a graph showing plating thickness distribution when the shielding frame was and was not employed.
FIG. 13B shows the measurement position for plating thickness of the printed circuit board.

In accordance with the foregoing arrangement, a printed circuit board 104 is attached by suspending a plurality of the second electrically conductive members 114, 114 . . . from the first electrically conductive member 111, inserting the taper pins 119 at the lower ends of the members 114 into the engagement holes 121, 121 . . . in the positioning member 122 attached to the lower wall 120c of the shielding frame 120 upon adjusting the spacing between adjacent ones of the electrically conductive members 114, 114 so as to conform to the horizontal width of the printed circuit board 104, and then securing the electrically conductive members 114, 114 in position by means of the fasteners 115a. Since the engagement holes 121 have the form of a conical countersink, the taper pins 119 slide into the centers of the holes 121 smoothly and mate with the holes in an accurate manner. Continuing, either the left or right side of the printed circuit board 114 is abutted against the contact 118a of a supporting contact portion 118 on one of the second electrically conductive members 114, and the other side of the printed circuit board is abutted against the contact 117a of a supporting contact portion 117 on a neighboring one of the second electrically conductive members 114. Thus, with one side of the printed circuit board 4 being pressed by the elastic force exerted by the supporting contact portion 118, the board is embraced and supported at its left and right sides between adjacent ones of the second electrically conductive members 114, 114. After a multiplicity of the printed circuit boards 104, 104 . . . have been attached in the above manner along the longitudinal direction of the first electrically conductive member 111 by successive pairs of the second electrically conductive members 114, 114 with the assistance of the longitudinal pressing force applied by supporting contacts 118a, the first electrically conductive member 111 is conveyed by the conveyance mechanism to the plating bath 106 where the printed circuit boards 104, 104 . . . are immersed into the plating solution 107 as shown in FIG. 12. The printed circuit boards 104, 104 . . . are plated by connecting them to a negative voltage through the rods 113, first electrically conductive member 111, second electrically conductive members 114, and supporting contact portions 117, 118. The outer printed circuit boards 104, 104 ... of the plural array of boards are prevented by the shielding frame 120 from developing a concentration of electric current during the plating operation, so that all of the printed circuit boards can be plated to a uniform thickness.

Figure 13B:
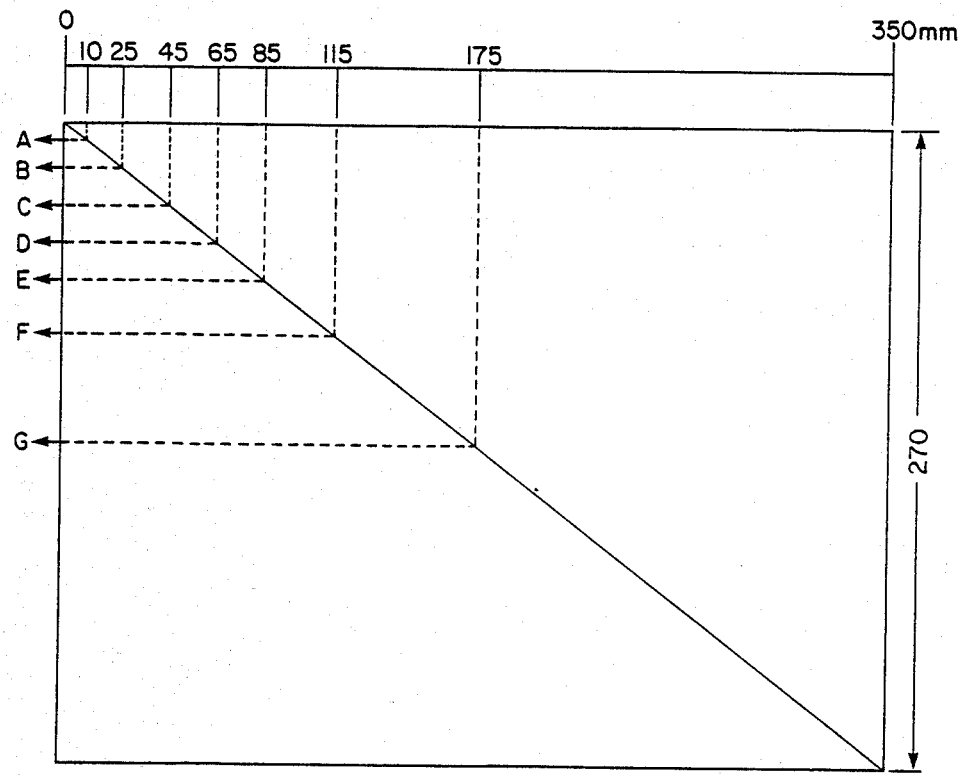

FIG. 13A is a graph which, based on the results of experiments, shows the distribution in plating thickness on printed circuit boards 104, 104 ... at each of several positions when the shielding frame was and was not employed. The experiments were made under a condition in which printed circuit boards of a size 270 mm width and 350 mm length were plated for 60 minutes at a cathod current density $3A/dm^2$ using a cupric sulfate plating solution. In FIG. 13A, A to G in abscissa show measurement positions for plating thickness and ordinate indicates the plating thickness. In FIG. 13B, A on the horizontal axis represents an outermost printed circuit board, and G a centrally located printed circuit board. From this experiment, it is revealed that the ratio of a printing thickness at position A at which a current is mostly concentrated with respect to that at position G at which the current distribution is minimum is 1.667 in a case where the shielding frame is employed and 2.375 in a case where the shielding frame is not employed. From this fact, it appears that the rate of improvement is about 60%. Accordingly, it is confirmed that using the shielding frame 120 corrects the non-uniformity in plating thickness to a remarkable degree.

It should be noted that the plating solution is free to pass through the openings 120 in the shielding frame 120 and through the engagement holes 121 in the positioning member 122 when the first electrically conductive member 111 is moved up and down in the plating bath 106 by the conveyance mechanism.

Though the foregoing description deals with an embodiment wherein printed circuit boards are retained, it is obvious that the present invention can be employed to retain other articles to be plated in addition to circuit boards.

Figure 14:
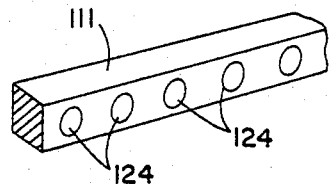
FIGS. 14A and 14B show an arrangement in which the first electrically conductive member is provided with positioning recesses to enable positioning of the upper end of the second electrically conductive member.
Figure 14:
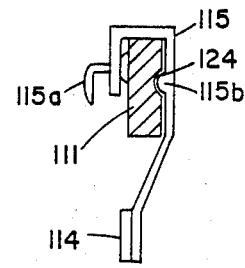

It is possible to adopt an arrangement in which the upper ends of the second electrically conductive members 114 are positioned as well as their lower ends. Specifically, as shown in FIG. 14, this can be accomplished by providing the first electrically conductive member 111 with positioning recesses 124, 124 at the same pitch as the engagement holes 121 in the positioning member 122, and by providing each hanger 115 of the second electrically conductive members 114 with a projection 115b adapted to fit into a positioning recess 124.

Figure 15:
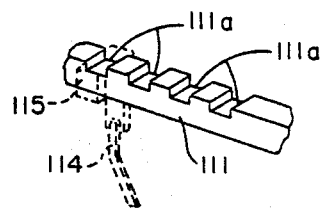
FIG. 15 is a modification of a part of the retaining rack of FIG. 6.

Positioning and fixing the second electrically conductive member 14 can be accomplished by means other than the fastener 115a. As illustrated in FIG. 15, positioning grooves 111a spaced apart by a prescribed pitch can be provided in the first electrically conductive member 111, with the second electrically conductive members 114 being positioned and fixed by fitting them into respective ones of the grooves 111a. Alternatively, both the positioning grooves 111a and the fasteners 115a can be used conjointly to position and secure the second electrically conductive members. It is possible also to enhance rigidity further by forming projections used to fit the parts together.

The retaining rack 29 thus mentioned has the following advantages.

(A) Articles having various dimensions can be retained by changing the distance between adjacent ones of the second electrically conductive members 114, 114. It is therefore unneccessary to prepare a variety of second electrically conductive members to conform to the dimensions of the articles to be plated, as in the prior art. Thus, only one variety of second electrically conductive member need be provided, thereby enabling a reduction in manufacturing cost and a simplification in storage and handling.

(B) Since articles are retained on both sides of a second electrically conductive member 114, and since supporting members do not intervene between adjacent ones of the vertically arranged articles, it is possible to reduce the spacing between an article and its neighbors on all four sides in order to array and support the articles quite closely. The articles can therefore be plated in large quantities to enhance operating efficiency. In addition, the dense array prevents a non-uniformity in plating thickness that occurs when articles are spaced far apart.

(C) Since the second electrically conductive members 114 are positioned and fixed at their upper and lower ends, swinging of the articles to be plated is prevented when the articles are immersed into and withdrawn from the plating bath 106 and when they are horizontally transported, thereby allowing large numbers of the articles to be retained on the first electrically conductive member 111.

(D) The shielding frame 120 enables a plating layer of a uniform thickness to be formed on each of a multiplicity of articles in an array.

(E) Providing the taper pin 119 at the lower end of a second electrically conductive member 114 assures and facilitates the positioning of that end.

What is claimed is:

1. A plating apparatus having a plurality of retaining racks, comprising:

loading-unloading stations for loading an unplated article onto each of said retaining racks and for unloading a plated article from said each of said retaining racks;

treating baths for plating the unplated articles;

a conveyance mechanism for conveying said retaining racks; and a pluality of stock yard stations for temporarily receiving said retaining racks, said stock yard stations being disposed immediately below a path traversed by the conveyance mechanism and adjacent the loading-unloading stations and treating baths;

in which each of said retaining racks, comprises:

a first electrically conductive member removably disposed so as to horizontally cross uppr portions of said treating baths;

a plurality of second electrically conductive members detachably provided on and electrically connected to said first electrically conductive member and depending from said first electrically conductive member at arbitrary positions therealong, said second electrically conductive members having a plurality of contact portions for urging and supporting, longitudinally of said first electrically conductive member, articles that are to be plated, and for supplying said articles with an electric current;

a shielding frame provided below said first electrically conductive member so as to surround the region in which said second electrically conductive members can move; and a positioning member for regulating the distance between the second electrically conductive members in such a manner that said articles to be plated are supported between contact members on adjacent ones of said second electrically conductive members;

said articles to be plated being pressured and supported between the contact portions of said adjacent ones of said second electrically conductive members.

2. A plating apparatus according to claim 1, in which an inward side of corner portions of the shielding frame is broader than the other portions of the shielding frame.

3. A plating apparatus having a plurality of retaining racks, comprising:

loading-unloading stations for loading an unplated article onto each of said retainng racks and for unloading a plated article from said each of said retaining racks;

treating baths for plating the unplated articles;

a conveyance mechanism for conveying said retaining racks; and a plurality of stock yard stations for temporarily receiving said retaining racks, said stock yard stations being disposed immediately below a path traversed by the conveyance mechanism and adjacent the loading-unloading stations and treating baths;

in which each of said retaining racks, comprises:

a first electrically conductive member removably disposed so as to horizontally cross upper portions of said treating baths;

a plurality of second electrically conductive members detachably provided on and electrically connected to said first electrically conductive member and depending from said first electrically conductive member at arbitrary positions therealong, said second electrically conductive members having a plurality of contact portions for urging and supporting, longitudinally of said first electrically conductive member, articles that are to be plated, and for supplying said articles with an electric current;

taper pins formed in lower ends of said second electrically conductive members and electrically insulated from said second electrically conductive members;

a shielding frame provided below said first electrically conductive member so as to surround a region in which said second electrically conductive members can move; and a positioning member for regulating the distance between the second electrically conductive members in such a manner that said articles to be plated are supported between contact members on adjacent ones of said second electrically conductive members, and having a plurality of flared engagement holes for mating with said taper pins;

said articles to be plated being pressured and supported between the contact portions of said adjacent ones of said second electrically conductive members.

4. A plating apparatus having a plurality of retaining racks, comprising:

loading-unloading stations for loading an unplated article onto each of said retaining racks and for unloading a plated article from said each of said retaining racks;

treating baths for plating the unplated articles;

a conveyance mechanism for conveying said retaining racks; and a plurality of stock yard stations for temporarily receiving said retaining racks, said stock yard stations being disposed immediately below a path traversed by the conveyance mechanism and adjacent the loading-unloading stations and treating baths;

in which each of said retaining racks, comprises:

a first electrically conductive member removably disposed so as to horizontally cross upper portions of said treating baths; and a plurality of second electrically conductive members detachably provided on and electrically connected to said first electrically conductive member and depending from said first electrically conductive member at arbitrary positions therealong;

said second electrically conductive members having a plurality of supporting contact portions for urging and supporting, longitudinally of said first electrically conductive member, articles that are to be plated, and for supplying said articles with an electric current, said articles to be plated being pressured and supported between the contact portions of adjacent ones of said second electrically conductive members.

5. A plating apparatus having a plurality of retaining racks, comprising:

loading-unloading stations for loading an unplated article onto each of said retaining racks and for unloading a plated article from said each of said retaining racks;

treating baths for plating the unplated articles;

a conveyance mechanism for conveying said retaining racks; and a plurality of stock yard stations for temporarily receiving said retaining racks, said stock yard stations being disposed immediately below a path traversed by the conveyance mechanism and adjacent the loading-unloading stations and treating baths;

in which each of said retaining racks, comprises:

a first electrically conductive member removably disposed so as to cross upper portions of said treating baths;

a plurality of second electrically conductive members detachably provided on and electrically connected to said first electrically conductive member and depending from said first electrically conductive member at arbitrary positions therealong, said secondary electrically conductive members having a plurality of contact portions for urging and supporting, longitudinally of said first electrically conductive member, articles that are to be plated, and for supplying said articles with electric current; and a positioning member for regulating the distance between the contact portions on adjacent ones of said second electrically conductive members;

said articles to be plated being pressured and supported between the contact portions of said adjacent ones of said second electrically conductive members.

6. A retaining apparatus for a plating apparatus having a plating bath, comprising:

a first electrically conductive member removably disposed so as to horizontally cross the upper portion of said plating bath;

a plurality of second electrically conductive members detachably provided on and electrically connected to said first electrically conductive member and depending from said first electrically conductive member at arbitrary positions therealong, said second electrically conductive members having a plurality of contact portions for urging and supporting, longitudinally of said first electrically conductive member, articles that are to be plated, and for supplying said articles with an electric current;

an electrically insulating shielding frame provided below said first electrically conductive member so as to surround the region in which said second electrically conductive members can move to prevent concentration of electric current to the outermost articles supported by said second electrically conductive member to provide a uniform plating thickness on said outermost articles; and a positioning member for regulating the distance between the second electrically conductive members in such a manner that said articles to be plated are supported between contact members on adjacent ones of said second electrically conductive members;

said articles to be plated being pressured and supported between the contact portions of said adjacent ones of said second electrically conductive members.

7. A retaining apparatus according to claim 6, in which an inward side of corner portions of the shielding frame is broader than the other portions of the shielding frame.

8. A retaining apparatus for plating having a plating bath, comprising:

a first electrically conductive member removably disposed so as to horizontally cross the upper portion of said plating bath;

a plurality of said electrically conductive members detachably provided on and electrically connected to said first electrically conductive member and depending from said first electrically conductive member at arbitrary positions therealong, said second electrically conductive members having a plurality of contact portions for urging and supporting, longitudinally of said first electrically conductive member, articles that are to be plated, and for supplying said articles with an electric current;

taper pins formed in lower ends of said second electrically conductive members and electrically insulated from said second electrically conductive members;

a shielding frame provided below said first electrically conductive member so as to surround a region in which said second electrically conductive members can move; and a positioning member for regulating the distance between the second electrically conductive members in such a manner that said articles to be plated are supported between contact members on adjacent ones of said second electrically conductive members, and having a plurality of flared engagement holes for mating with said taper pins;

said articles to be plated being pressured and supported between the contact portions of said adjacent ones of said second electrically conductive members.

* * * * *